United States Patent
Ngu et al.

(10) Patent No.: US 8,040,739 B2
(45) Date of Patent: Oct. 18, 2011

(54) CONFIGURABLE WRITE POLICY IN A MEMORY SYSTEM

(75) Inventors: Hui Hui Ngu, Penang (MY); Choon Keat Khor, Sungai Petani Kedah (MY)

(73) Assignee: eASIC Corporation, Santa Clara, CA (US)

( * ) Notice: Subject to any disclaimer, the term of this patent is extended or adjusted under 35 U.S.C. 154(b) by 186 days.

(21) Appl. No.: 12/365,019

(22) Filed: Feb. 3, 2009

(65) Prior Publication Data

US 2010/0195419 A1   Aug. 5, 2010

(51) Int. Cl.
 G11C 7/00   (2006.01)
 G11C 7/22   (2006.01)
(52) U.S. Cl. .................. 365/189.011; 365/191; 711/201
(58) Field of Classification Search ........... 365/189.011, 365/191, 194, 210.1, 233; 326/41; 711/201
See application file for complete search history.

(56) References Cited

U.S. PATENT DOCUMENTS

| | | | |
|---|---|---|---|
| 6,252,814 B1 * | 6/2001 | Tran et al. | 365/210.1 |
| 6,418,067 B1 * | 7/2002 | Watanabe et al. | 365/200 |
| 6,606,277 B2 * | 8/2003 | Takahashi | 365/233.1 |
| 7,157,937 B2 | 1/2007 | Apostol et al. | |
| 7,624,248 B1 * | 11/2009 | Wentzlaff et al. | 711/202 |
| 7,639,557 B1 * | 12/2009 | Chou et al. | 365/230.05 |
| 7,729,179 B2 * | 6/2010 | Pawlowski et al. | 365/189.05 |
| 2002/0024879 A1 * | 2/2002 | Tsuji et al. | 365/233 |

* cited by examiner

Primary Examiner — Anh Phung
Assistant Examiner — Toan Le
(74) Attorney, Agent, or Firm — Connolly Bove Lodge & Hutz LLP

(57) ABSTRACT

A configurable memory system may be able to support at least three different write policies, namely, no-read-on-write, read-before-write, and read-after-write. Such a system may include configurable write signal timing, configurable read signal timing, and/or configurable wordline enable signal timing. Static and/or dynamic configuration of the system may be used.

13 Claims, 16 Drawing Sheets

CONFIGURABLE WRITE POLICY IN A MEMORY SYSTEM

FIELD OF ENDEAVOR

Various embodiments of the invention may relate to memory systems and/or to the configurability thereof.

BACKGROUND OF THE INVENTION

The advantages of highly flexible memory blocks may be very desirable in structured application specific integrated circuit (ASIC) design, for example. A structured ASIC system often includes embedded memory system, which may be used to provide various types of memory functions. A common configurable random access memory (RAM) block may be arrayed multiple times across a structured ASIC chip, and this solo memory design may be used to serve various functions, such as first-in-first-out (FIFO) buffer, shift register, internet protocol (IP) packet buffer, system cache, video frame buffer, and processor code storage to name a few. Some of these applications require deeper depth but narrower width, while others require wider width but shallower depth. With the broad range of applications of structured ASIC devices, for example, the digital consumer, industrial, wireless, wireline, automotive and military markets, a versatile memory design may be highly desirable.

A versatile memory design may include the ability to be configured to different write policies. A write operation of a memory system can be categorized into three categories based on the reflected data at the output port, namely, no-read-on-write policy, read-before-write policy, and read-after-write policy. No-read-on-write policy refers to the basic write operation, where there is no read operation required when a write command is issued. In a no-read-on-write policy, the only operation executed when a write command is issued is the write operation, and the data output remains unchanged. Read-before-write policy enables the memory to do a read operation first from the memory location specified by ADDRESS[N:0] before overwriting the content of that memory location with the write data. The output will reflect the previously stored data. Read-after-write policy enables the memory to do a read operation on the memory location specified by the ADDRESS[N:0] after overwriting the content of the memory location with the write data. The output will reflect the new data being written into the memory.

In certain applications, for example, data shifting over time in a finite impulse response (FIR) filter equation, the memory may advantageously be able to read the previously stored data before writing new data to the same memory location, which effectively is a read-before-write operation. In other applications, for example, a comparator, it may be advantageous for the memory to write new data before reading the new data from the same memory location, which effectively is a read-after-write operation. In a conventional memory system, a back-to-back read and write would normally need at least two clock cycles.

Methods employed for personalizing memory configurations can be divided into two categories: static configuration and dynamic configuration. Static configuration in this context may be done through via programming, which may be a single layer of vias or multiple layers of vias. Dynamic configuration in this context may be done through the usage of multiplexer.

Some approaches of configuring read or write with a variety of data widths have been described in U.S. Pat. No. 7,157,937 B2. This patent describes a configurable logic array that may include: a multiplicity of logic cells, a multiplicity of device customizable I/O cells; a multiplicity of configuration customizable RAM blocks; a ROM block with customizable contents; and a microprocessor with customizable I/O for configuring and testing the array, where the customizations may all be done on a single via layer.

In view of the above, it would be desirable to have an easily customizable memory structure that may be customized to implement various read-write policies.

SUMMARY OF VARIOUS EMBODIMENTS OF THE INVENTION

Various embodiments of the present invention may relate to an approach to design a versatile and flexible memory system that can function as no-read-on-write, read-before-write and read-after-write memory system, which may serve to improve the memory throughput and to increase the effective memory bandwidth. Via programming, using a single layer of vias or multiple layers of vias, and/or multiplexing may be used to personalize the memory configuration.

Embodiments of the current invention may provide a method to configure different write policies of a memory system. Such a memory system may be configured such that, during a write operation, the memory can be set to have the data output remain unchanged, reflects the new data being written into it or, reflect the previous stored data. This capability may be enabled with the strategic placement of programmable vias and/or multiplexers at a few specific locations in the memory block.

Such embodiments of the current invention may provide a way to support read-before-write and read-after-write in one clock cycle, to thereby improve the memory throughput and increase the effective bandwidth. Such embodiments of the current invention may also provide flexibility for the memory to be configured to any of the three policies, by the means of static or dynamic configuration.

A circuit according to various embodiments of the invention may include a memory array, a wordline decoder, precharge, read circuitry, and write circuitry, along with programmable vias and/or multiplexers at one or more of the following locations:

(a) write signal(s);
(b) wordline enable signal(s); and
(c) read signal(s).

BRIEF DESCRIPTION OF THE DRAWINGS

Various features and advantages of the present invention will become apparent upon consideration of the following detailed description and the accompanying drawings, in which.

DETAILED DESCRIPTION OF EMBODIMENTS OF THE INVENTION

Figure 1:
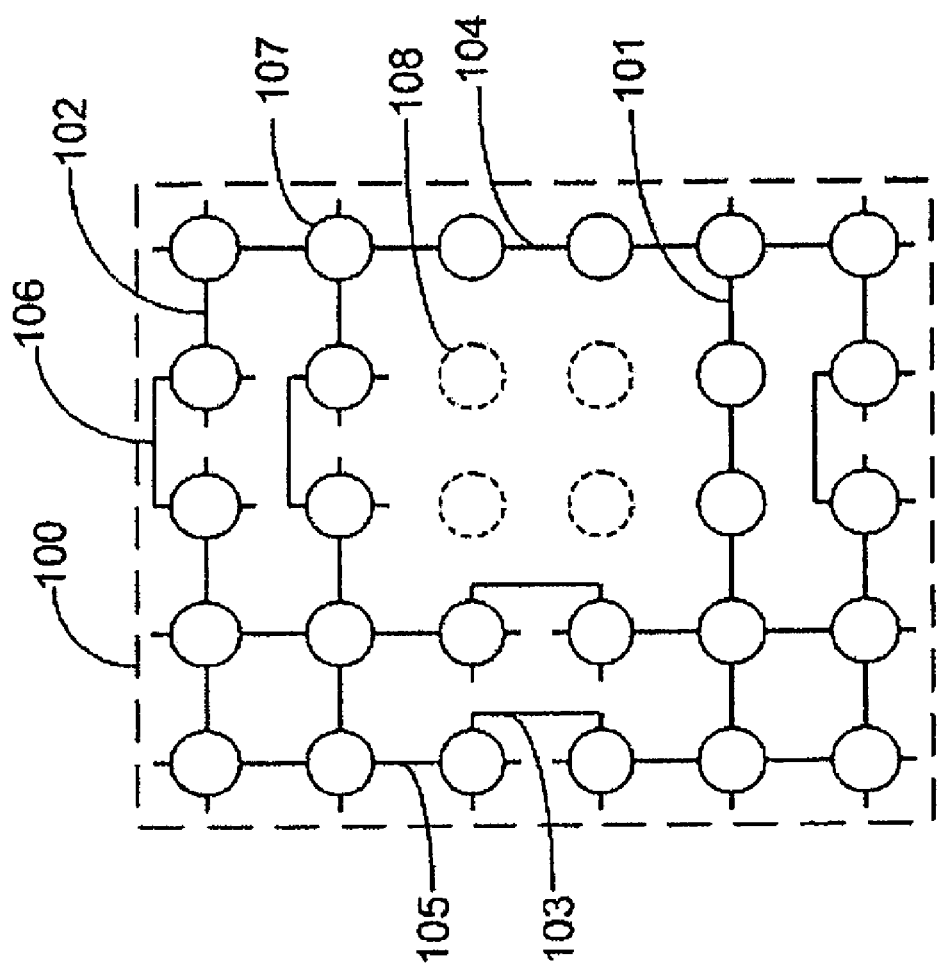
FIG. 1 is a simplified illustration of a section of two layers of metal interconnect and a customizable via layer between them.

FIG. 1 shows a small section of the interconnect structure within an exemplary customizable integrated circuit device, similar to what may be described in U.S. Pat. No. 7,157,937. The section 100 is an abstraction of the interconnect segments and via sites that may be found within a customizable integrated circuit, which contains two layers in this example. In this example, the top layer 101 may be comprised of horizontal segments 102 and vertical jumpers 103; and the bottom layer 104 may be comprised of vertical segments 105 and horizontal jumpers 106. Segments of metal can be connected by selecting one or more via sites 107, which may be placed between a vertical and a horizontal interconnect. In this example, the possible via sites do not include sites such as 108, which do not reside between jumpers or segments of the two layers. To signify the connection of metal from two layers in this example, the ends of the jumpers 103 and 106 are drawn in the direction of the segments on the layer in which the jumpers reside. In this way, a schematic representation of the physical wire segments and via sites may be created.

Figure 2:
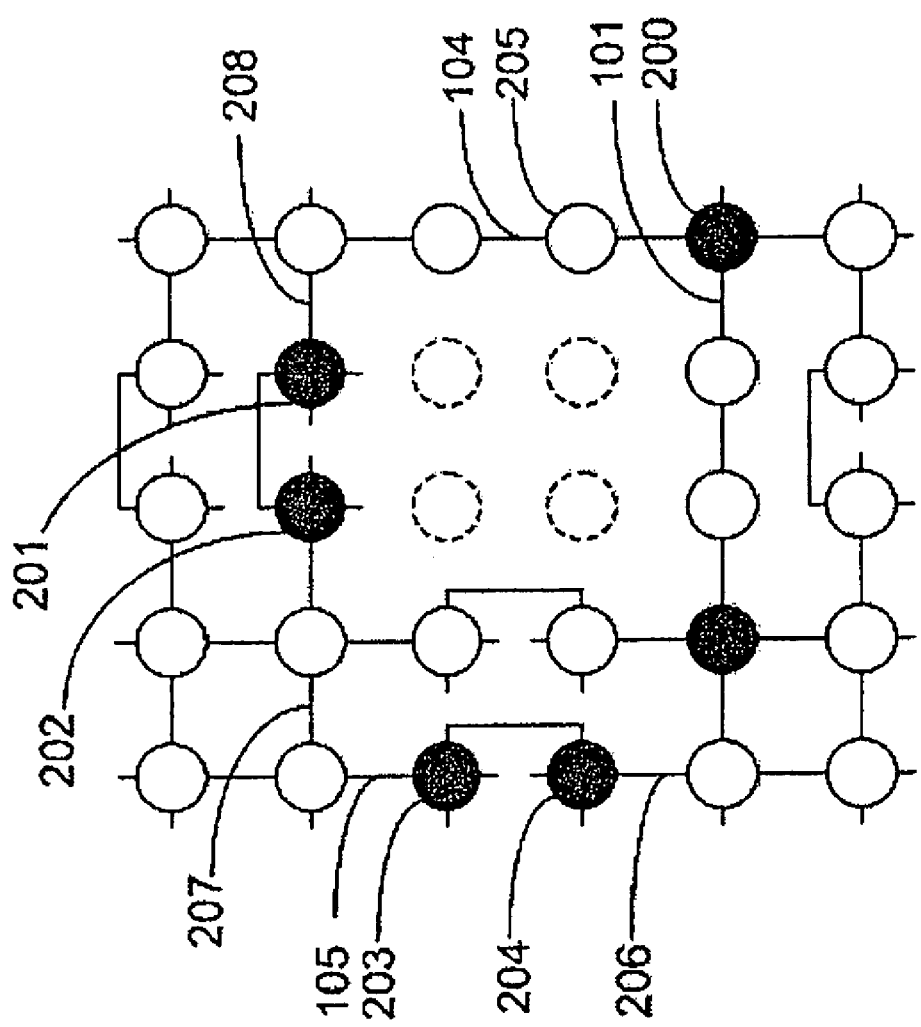
FIG. 2 is an illustration from FIG. 1 with selected via sites.

FIG. 2 may correspond to FIG. 1, with the addition of selected programmable vias. The presence of the selected vias 200, 201, 202, 203 and 204, which is symbolized by darkened sites in the figure, signifies a shorted connection in such a way that electrical current can pass freely between the two layers through the vias. Via 200 may define an active connection between horizontal segment 101 and vertical segment 104. A set of selected vias 203 and 204 may define an active connection between vertical interconnects 105 and 206. A set of selected vias 201 and 202 may define an active connection between horizontal interconnects 207 and 208. The location of unselected via 205 may be left open when mapped to the logical site, and this may signify that no physical connection has been (or will be) made between the two metal segments that could be connected using the via 205.

Figure 3:
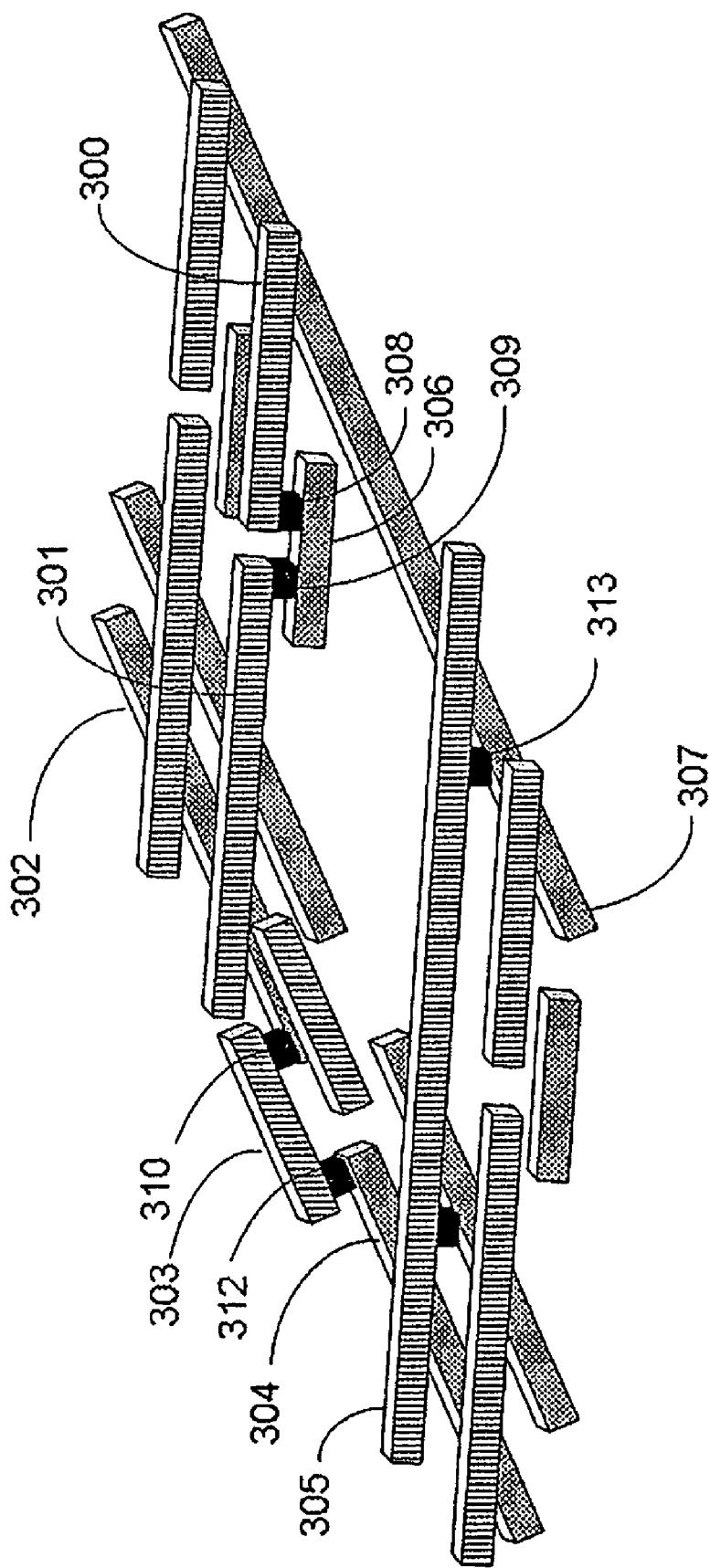
FIG. 3 is an illustration of the physical aspect of two layers of metal interconnect and vias connection between them with reference to FIG. 2.

FIG. 3 shows a possible physical representation of FIG. 2, a cross section of the interconnect segments and via sites. FIG. 3 contains vertical segment 302, vertical jumper 303, horizontal segment 301, and horizontal jumper 306. A vertical segment 307 may be connected to the horizontal segment 305 by via 313. Two segments of horizontal interconnect, 300 and 301, which may be located at a top layer, may be connected to each other by vias 308 and 309, joined by a horizontal jumper in a lower layer. Two segments of vertical interconnect 302 and 304, which may be located in a lower layer, may be connected to each other by vias 310 and 312, joined by the vertical jumper in a higher layer, which may, for example, be the top layer.

Figure 4:
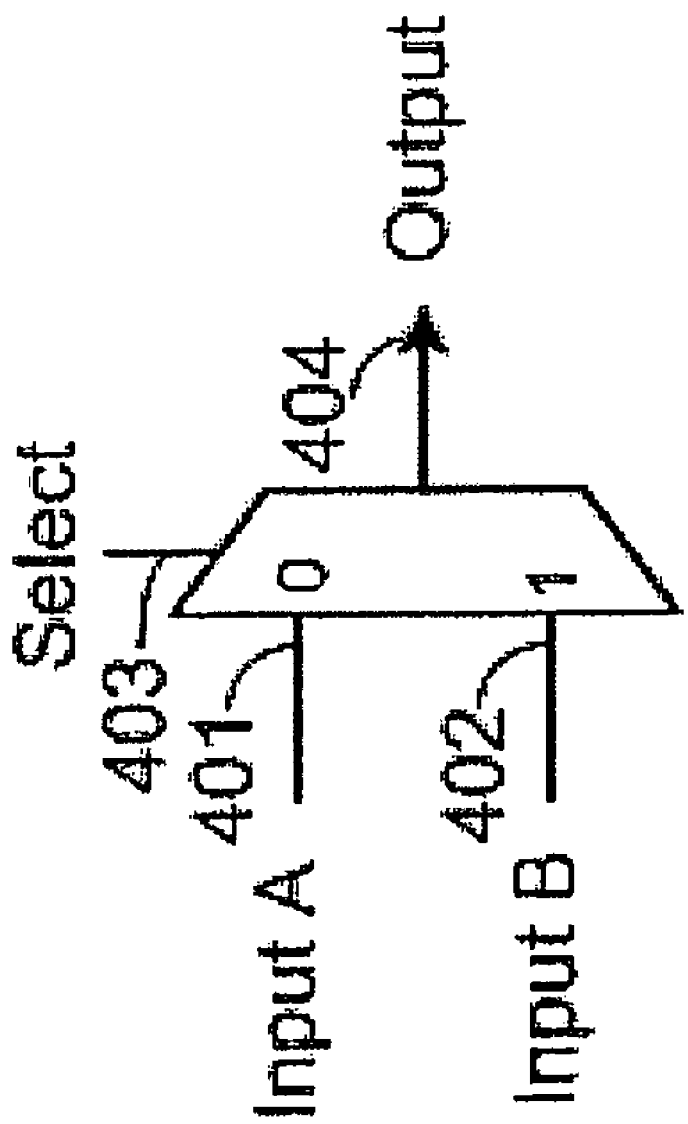
FIG. 4 is a simplified illustration of a 2:1 multiplexer that may be used for dynamic configuration according to an embodiment of the present invention.

FIG. 4 is a simplified illustration of a multiplexer that may be used for dynamic configuration according to an embodiment of the present invention. The 2:1 multiplexer may include two input ports, one output port and one control select signal (namely, Input A 401, Input B 402, Output 404 and Select 403). The output of the multiplexer may be determined by the select control signal. When Select 403 is 0, Output 404 may be taken from Input A 401. When Select 404 is 1, Output 404 may be taken from Input B 402 instead.

Figure 5:
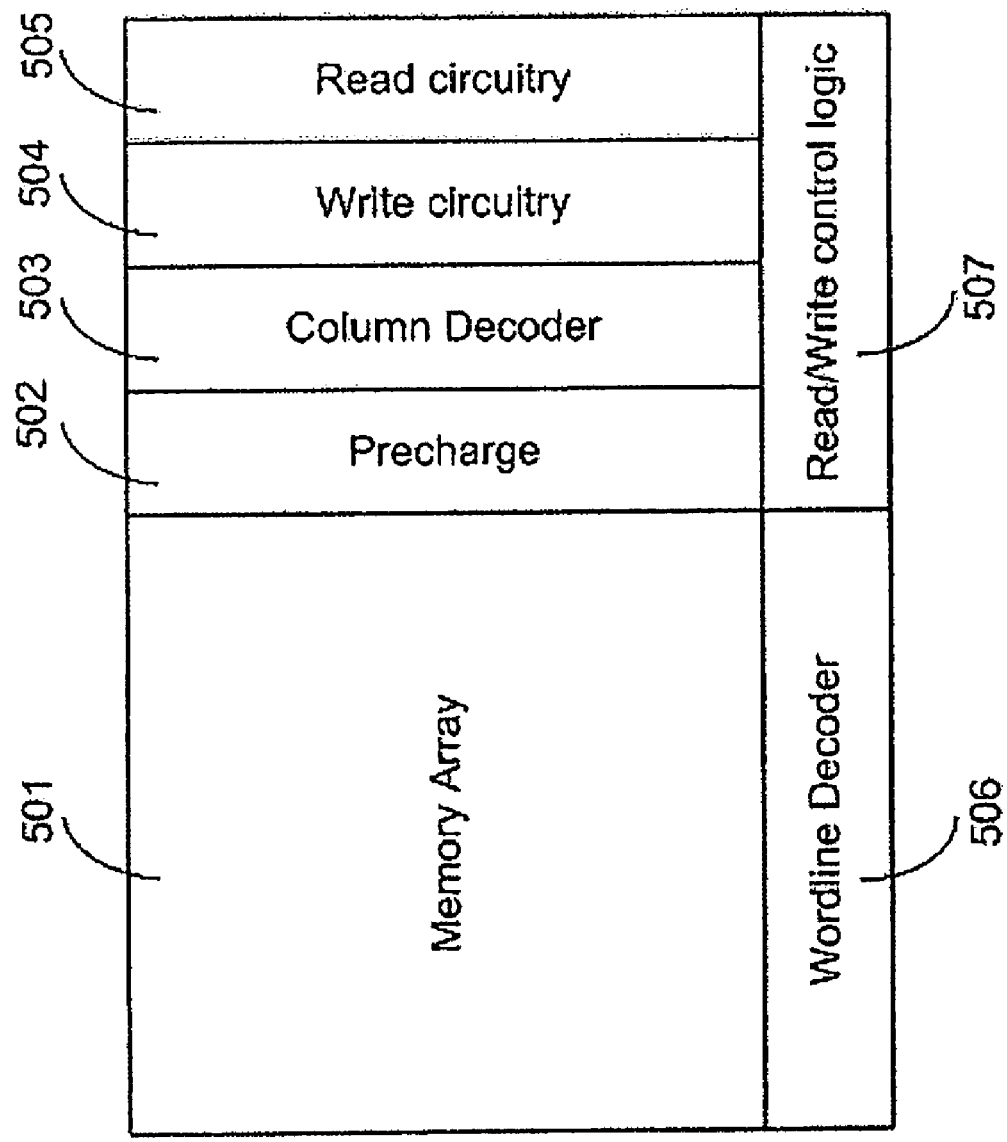
FIG. 5 is a simplified block diagram of a memory array structure.

FIG. 5 is a simplified block diagram of an exemplary memory array structure. A memory system may include: memory array 501, precharge 502, column decoder 503, write circuitry 504, read circuitry 505, wordline decoder 506, and read/write control circuitry 507. Write circuitry 504 may include write drivers, which may be tristate buffers enabled with write enable signals. Read circuitry 505 may include sense amplifiers, which may be enabled with read enable signals. Wordline decoder 506 may include wordline enable signals, wordline decoders and wordline drivers.

Figure 6:
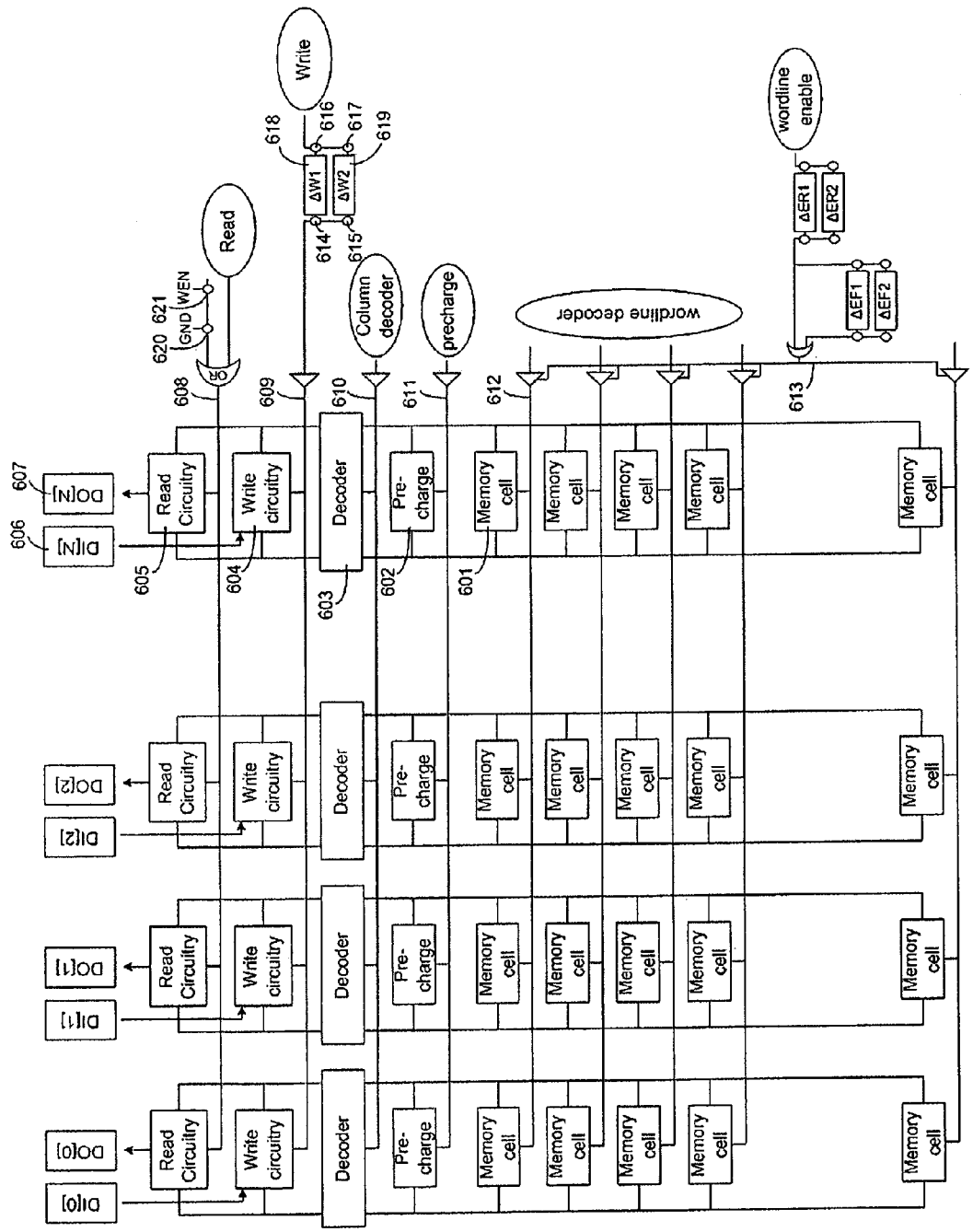
FIG. 6 is a simplified illustration of a static configurable write policy memory system in accordance with various embodiments of the present invention.

FIG. 6 is a simplified illustration of a static configurable write policy memory system in accordance with various embodiments of the present invention. The circuit of FIG. 6 may include memory cell 601, precharge 602, decoder 603, write circuitry 604, read circuitry 605, input port 606, and output port 607. At the decoder side, the circuit may include signal generation and drivers for the following signals: read 608, write 609, column decoder 610, precharge 611, wordline 612, and wordline enable 613. Various embodiment of the present invention may allow two options for the read operation. In the first option, the read operation may be disabled during a write operation so that during a write operation, the output retains whatever was on the output data port before. In the second option, the read operation may be enabled during a write operation as well, so that during a write operation, the output port reflects either old data or new data. A write enable (WEN) signal may be used to issue a write command, while the complement of WEN, i.e., NOT(WEN) may be used to issue a read command. To implement the first option, read logic may be ORed with GND by programming via 620 to conduct. When via 620 is programmed to conduct, a read operation may commence only when a read command is being issued. To implement the second option, read logic may be ORed with WEN by programming via 621 to conduct. When via 621 is programmed to conduct, a read operation may commence in every cycle, both when a read command is being issued and when a write command is being issued.

Various embodiments of the present invention may allow the write signal generation to be adjustable using the programmable vias 614, 615, 616 and 617. For example, when vias 614 and 616 are programmed, the write signal may be generated after a delay of W1 618. When vias 615 and 617 are programmed, the write signal may be generated after a delay of W2 619. Likewise, the wordline enable signal may be adjusted using programmable vias, as shown. Wordline generation may be controlled by the wordline enable signal, and by adjusting the wordline enable signal, the wordline signal may be adjusted accordingly.

Figure 7:
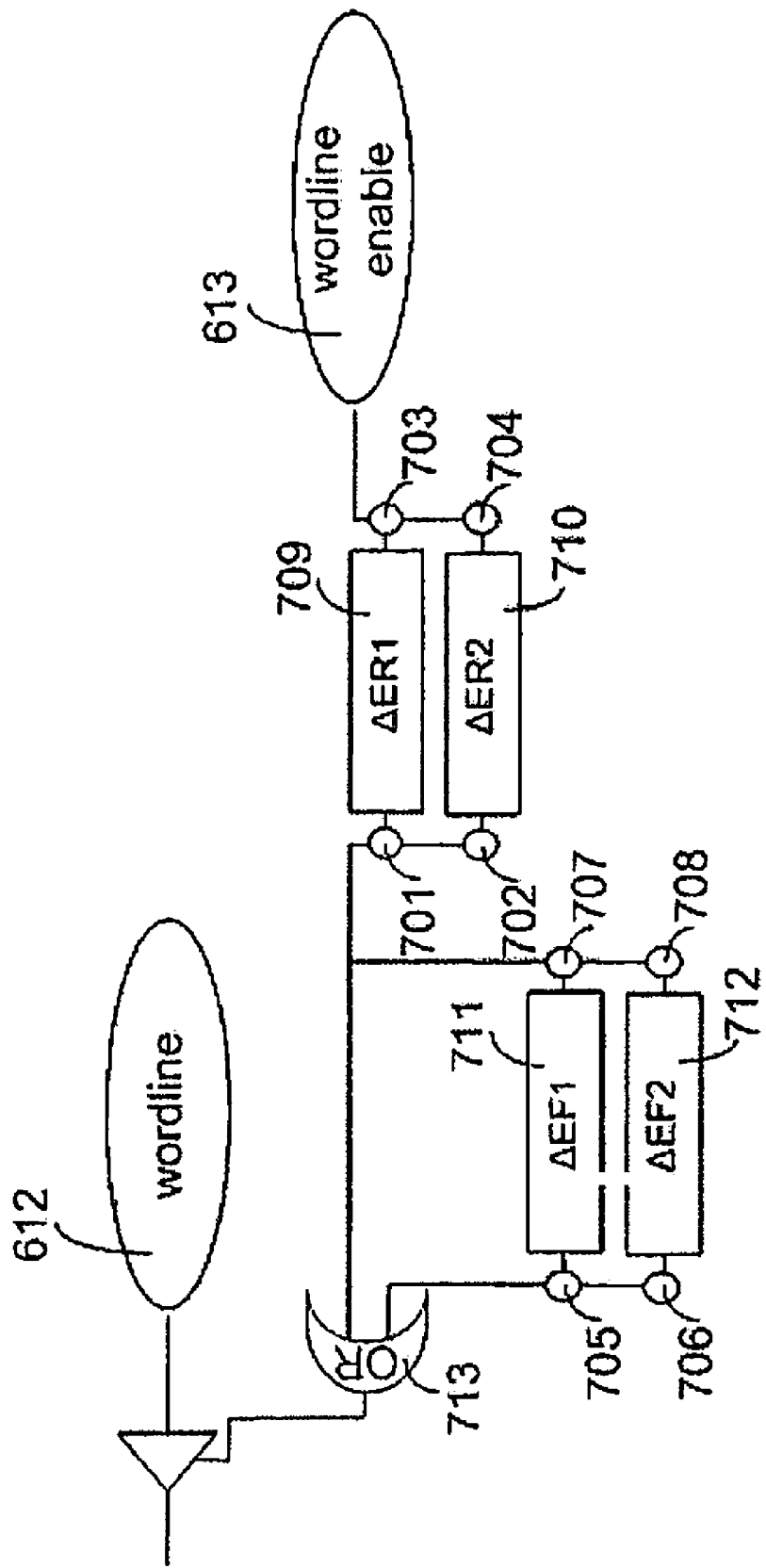
FIG. 7 is a simplified illustration of wordline signal generation, according to various embodiments of the invention, with reference to FIG. 6.

FIG. 7 shows a simplified illustration of wordline signal generation, according to various embodiments of the invention, which may correspond to a portion of FIG. 6 enlarged for clarity, with labeled programmable vias 701, 702, 703, 704, 705, 706, 707 and 708. Both the rising edge and falling edge of a wordline enable signal can be adjusted independently with the "chopper" circuit, where 713 is an OR gate. If vias 701 and 703 are programmed, the wordline enable signal may be generated after a delay of ER1 709. However, if vias 702 and 704 are programmed, the wordline enable signal may be generated after a delay of ER2 710. In a similar way, the falling edge of the wordline enable signal can be further delayed by selecting either delay cell 711 or delay cell 712.

Figure 8:
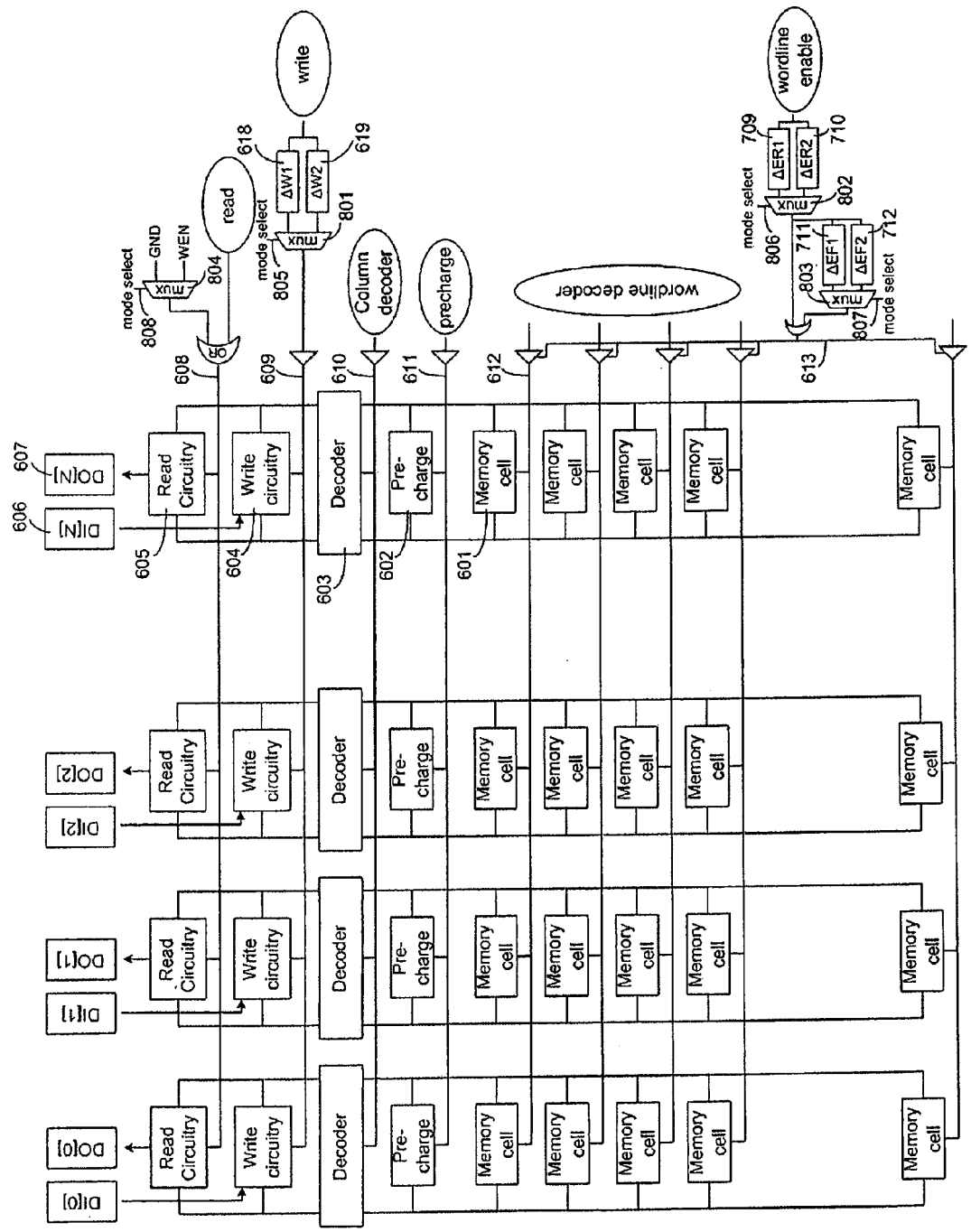
FIG. 8 is a simplified illustration of a dynamic configurable write policy memory system in accordance with various embodiments of the present invention.

FIG. 8 is a simplified illustration of a dynamic configurable write policy memory system in accordance with various embodiments of the present invention. Similar to FIG. 6, the circuit of FIG. 8 may include memory cell 601, precharge 602, decoder 603, write circuitry 604, read circuitry 605, input port 606, and output port 607. At the decoder side, the circuit may include signal generation and drivers for the following signals: read 608, write 609, column decoder 610, precharge 611, wordline 612, and wordline enable 613. Instead of using programmable vias to configure the memory circuit, in this case a dynamic configuration may be done using multiplexers. The read logic may be ORed with either WEN or GND. When the mode select 808 is "0", the read logic may be ORed with GND. However, when the mode select 808 is "1", the read logic may be ORed with WEN instead.

Various embodiments of the present invention allow the write signal generation to be adjustable using a multiplexer 801. When mode select 805 of multiplexer 801 is "0", the write signal may be generated after a delay of W1 618. However, when mode select 805 of multiplexer 801 is "1", the write signal may be generated after a delay of W2 619. Likewise, the wordline enable signal may be adjusted using multiplexers 802 and 803. When the mode select 806 of multiplexer 802 is "0", the wordline enable signal may be generated after a delay of ER1 709. However, when the mode select 806 of multiplexer 802 is "1", the wordline enable signal may be generated after a delay of ER2 710. In a similar way, the falling edge of the wordline enable signal may be further delayed with either delay cell 711 or delay cell 712. When the mode select 807 of multiplexer 803 is "0", the falling edge of wordline enable signal may be further delayed by EF1 711. When the mode select 806 of multiplexer 803 is "1", the falling edge of wordline enable signal may be further delayed by EF2 712.

Figure 9:
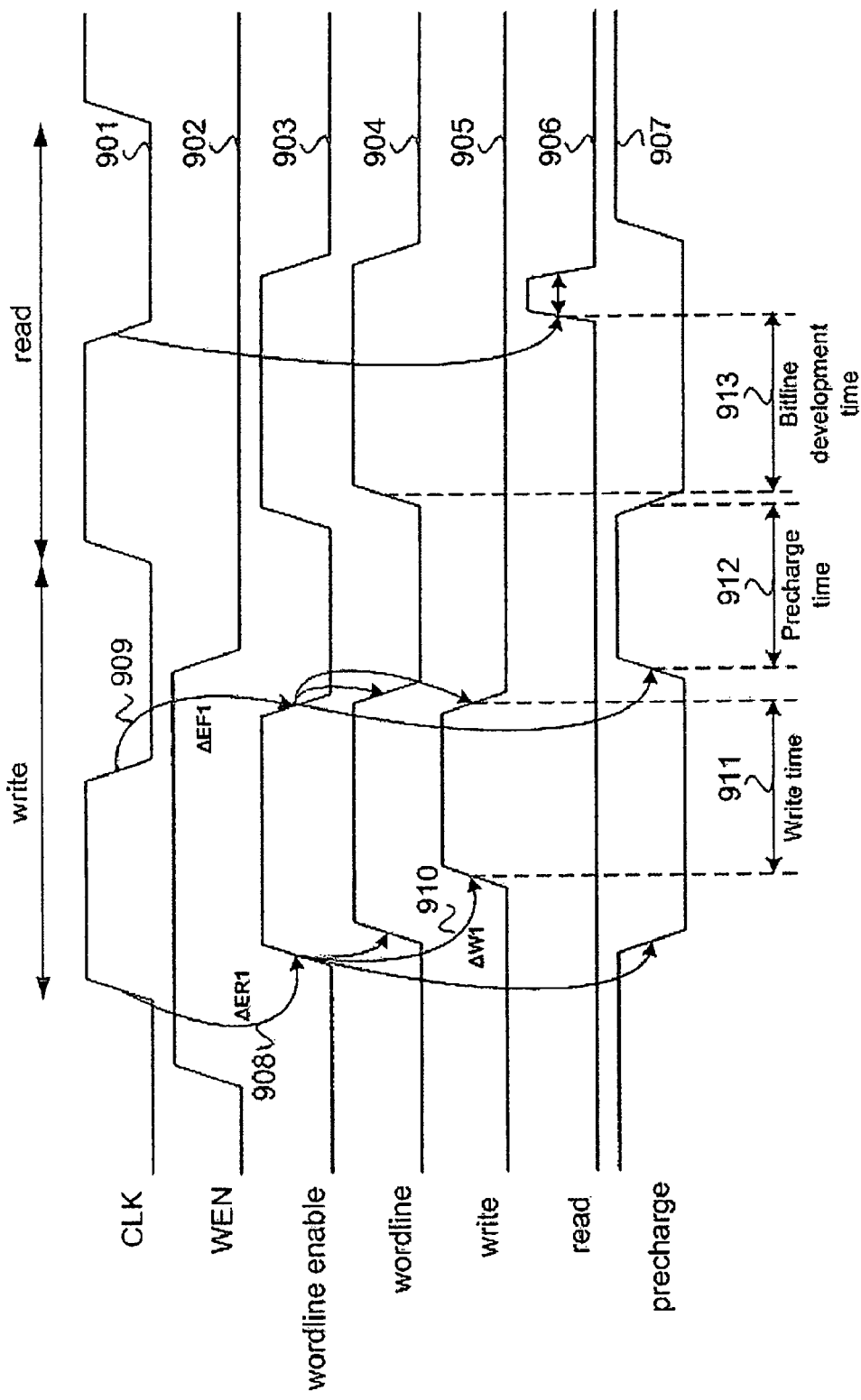
FIG. 9 illustrates waveforms demonstrating the relationships between various signals for a write operation in the no-read-on-write policy, according to various embodiments of the invention.

FIG. 9 illustrates waveforms demonstrating the relationships between various signals for a write operation of a conventional memory system. This may be comparable to the no-read-on-write policy, according to the terminology of the present disclosure. FIG. 9 includes waveforms for CLK 901, WEN 902, wordline enable 903, wordline 904, write 905, read 906 and precharge 907. Both CLK 901 and WEN 902 may be external signals. CLK 901 may represent a clock signal and WEN 902 may represent a command signal. A high pulse WEN 902 may be used to issue a write command to the memory system, while a low pulse WEN 902 may be used to issue a read command to the memory system.

A write operation may commence when the memory is enabled and WEN 902 is held high. Wordline enable signal 903 may be generated after a certain delay (shown in FIG. 9 as ER1, but not limited thereto) from the clock 901. The rising edge may have a delay of ER1 908 from the clock, while the falling edge may have a delay of EF1 909 from the clock. Wordline signal 904, which may be enabled by wordline enable signal 903, may have a fixed delay with respect to the wordline enable signal. Subsequently, a write signal 905 may be issued after a delay of W1 910 with respect to wordline enable signal 903, and it may be active for a period of time 911 for the memory cell to perform a successful write. After the data is successfully written into the memory content, the precharge signal 907 may be issued with respect to the falling edge of wordline enable signal 903. This may be used to guarantee that precharge will only happen after the wordline is closed, so that the memory content may not be corrupted. Precharge may be activated for a period of time 912 and may be deactivated with respect to the rising edge of the wordline enable signal 903, before the start of the next operation.

A read operation may commence when the memory is enabled and WEN 902 is held low. Wordline enable 903 and wordline 904 signals generation may be similar to the write operation. After the wordline is opened, the bitline may be given a period of time 913 to develop before the sense amplifier is activated. The sense amplifier may be enabled by read signal 906, which may be generated with respect to the falling edge of clock 901. After the data is successfully read, the precharge signal may be issued in a similar way as in the write operation, where the precharge signal 907 may be activated with respect to the falling edge of the wordline enable signal 903 and deactivated with the respect to the rising edge of the wordline enable signal 903.

Figure 10:
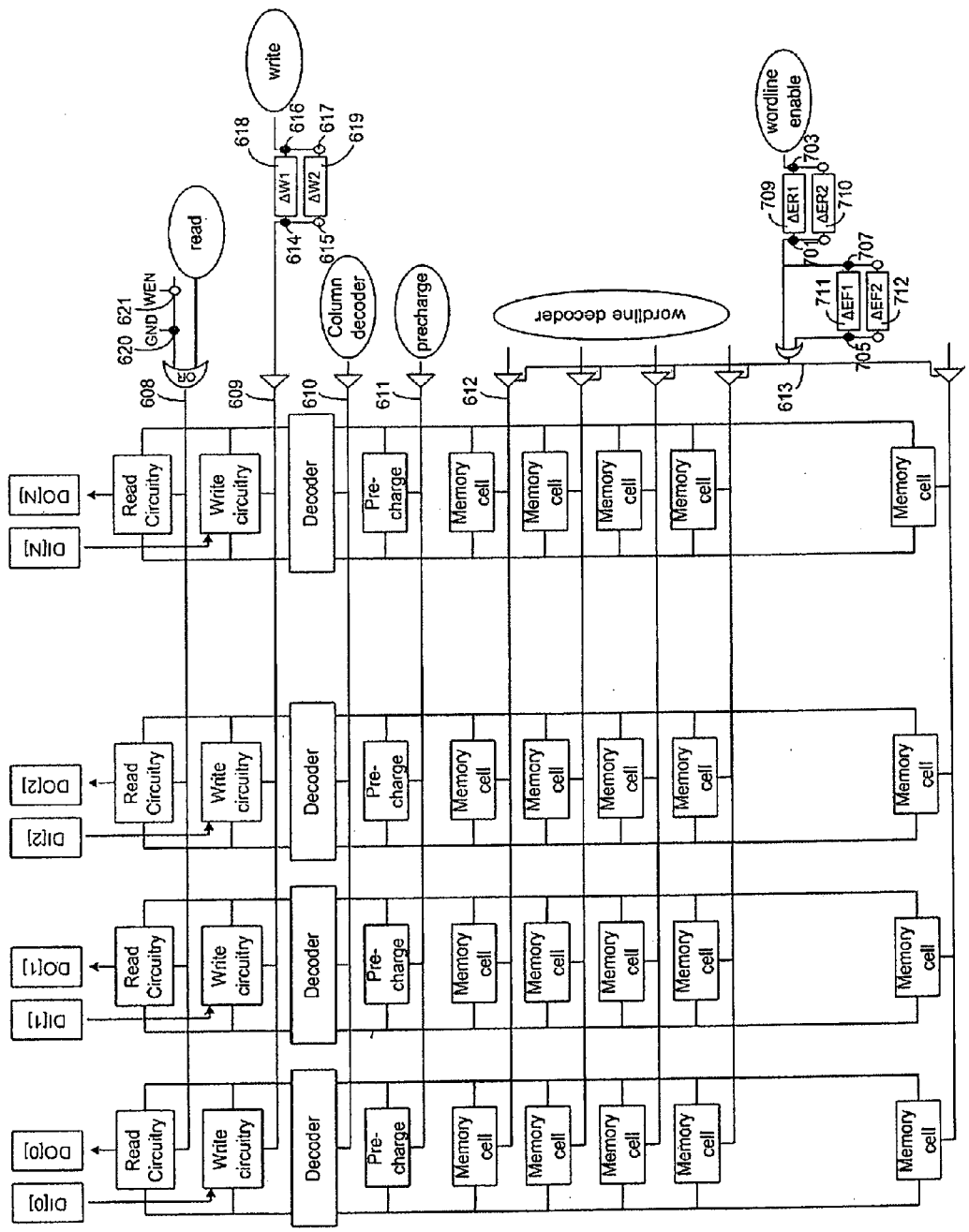
FIG. 10 is an example of a static configuration of the no-read-on-write policy in accordance with various embodiments of the present invention.

FIG. 10 is an example of a static configuration (i.e., by programming various programmable vias) of the no-read-on-write policy derived from the circuit in FIG. 6, in accordance with various embodiments of the present invention. Darkened programmable vias, for example, vias 620, 614, 616, 701, 703, 705 and 707, signify the presence of vias at those particular locations, which enable electrical conduction between the crossover interconnects at those points. In the no-read-on-write policy, the read signal 608 may be the result from the read logic being ORed with GND. A read pulse may only be generated when WEN is low. A write signal 609 may be generated with W1 delay cell 618, which may correspond to the delay W1 910 in FIG. 9. A wordline enable signal 613 may be generated with ER1 delay 709, and the falling edge of the wordline enable signal 613 may be further delayed with EF1 delay 711. These may correspond to the delays ER1 908 and EF1 909 in FIG. 9.

To dynamically configure (i.e., using multiplexers as in FIG. 8) a no-read-on-write policy, all the mode selects 808, 805, 806 and 803 may be set to "0". Referring to FIG. 8, read signal 608 may be the result from read logic being ORed with GND, and write signal 609 may be generated with W1 delay 618. Wordline enable signal 613 may be generated with ER1 delay 709, and the falling edge of the wordline enable signal 613 may be further delayed with EF1 delay 711. Both the static and dynamic configurations (i.e., as described in this paragraph and in the immediately preceding paragraph) may have the same outcome, which may correspond to the timing waveform of a no-read-on-write policy as shown in FIG. 9.

Figure 11:
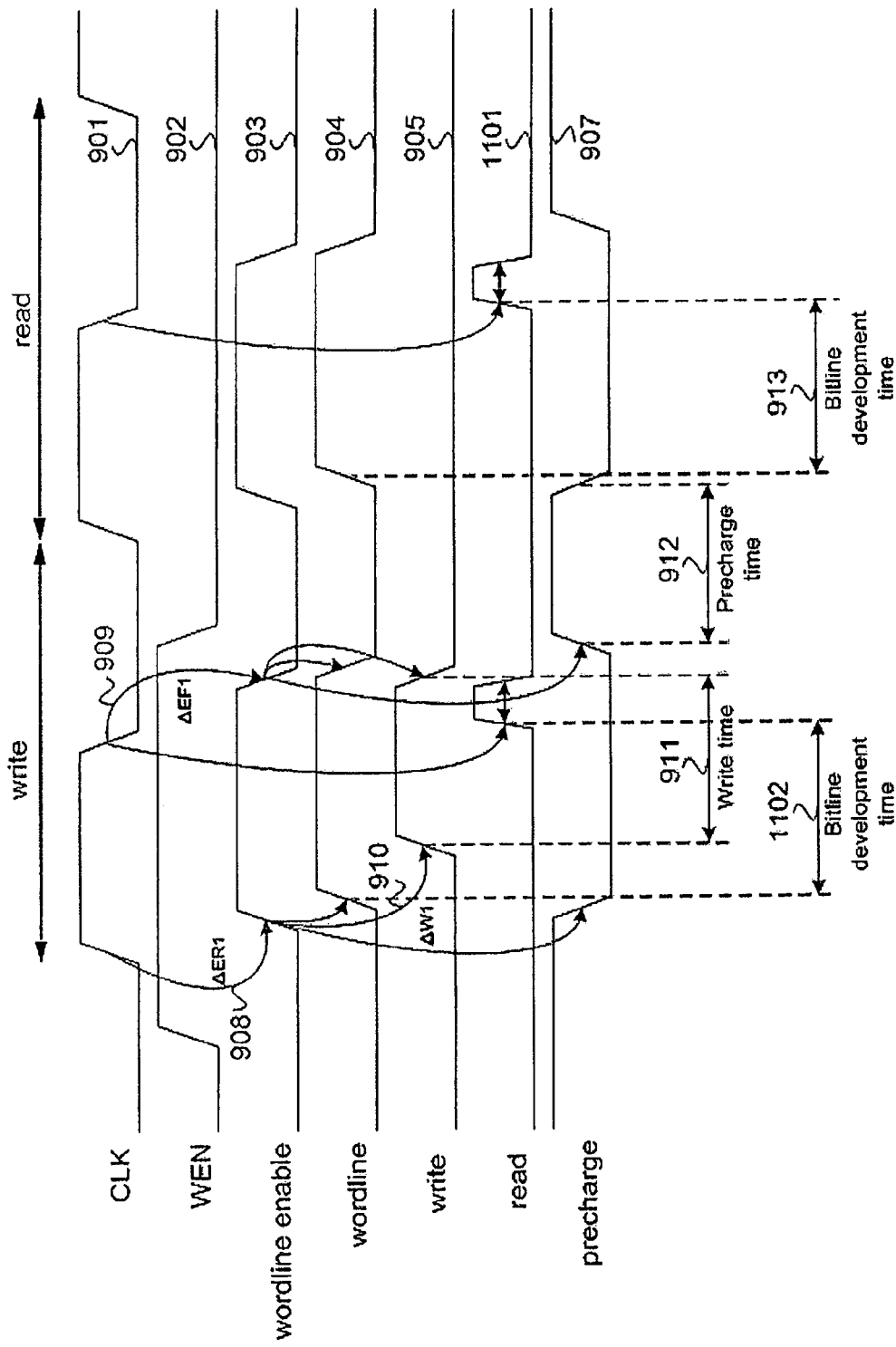
FIG. 11 illustrates waveforms demonstrating the relationships between various signals for the read-after-write policy, according to various embodiments of the invention.

FIG. 11 illustrates waveforms that may be used to demonstrate the relationships among various signals in the read-after-write policy. FIG. 11 includes waveforms for CLK 901, WEN 902, wordline enable 903, wordline 904, write 905, read 1101 and precharge 907. All the signal generation and timing windows may be identical with respect to the no-read-after-write policy illustrated in FIG. 9, except for read signal

1101. In a read-after-write policy, once the write command has been issued, a write operation may commence first, followed by a read operation, in a single cycle. To accomplish this, read signal 1101 may be issued by both a write command and a read command. The read signal 1101 generation may be similar for both the write command and the read command, which may be with respect to the falling edge of the clock 901, and consequently, bitline development time 1102 may be the same as bitline development time 913.

Figure 12:
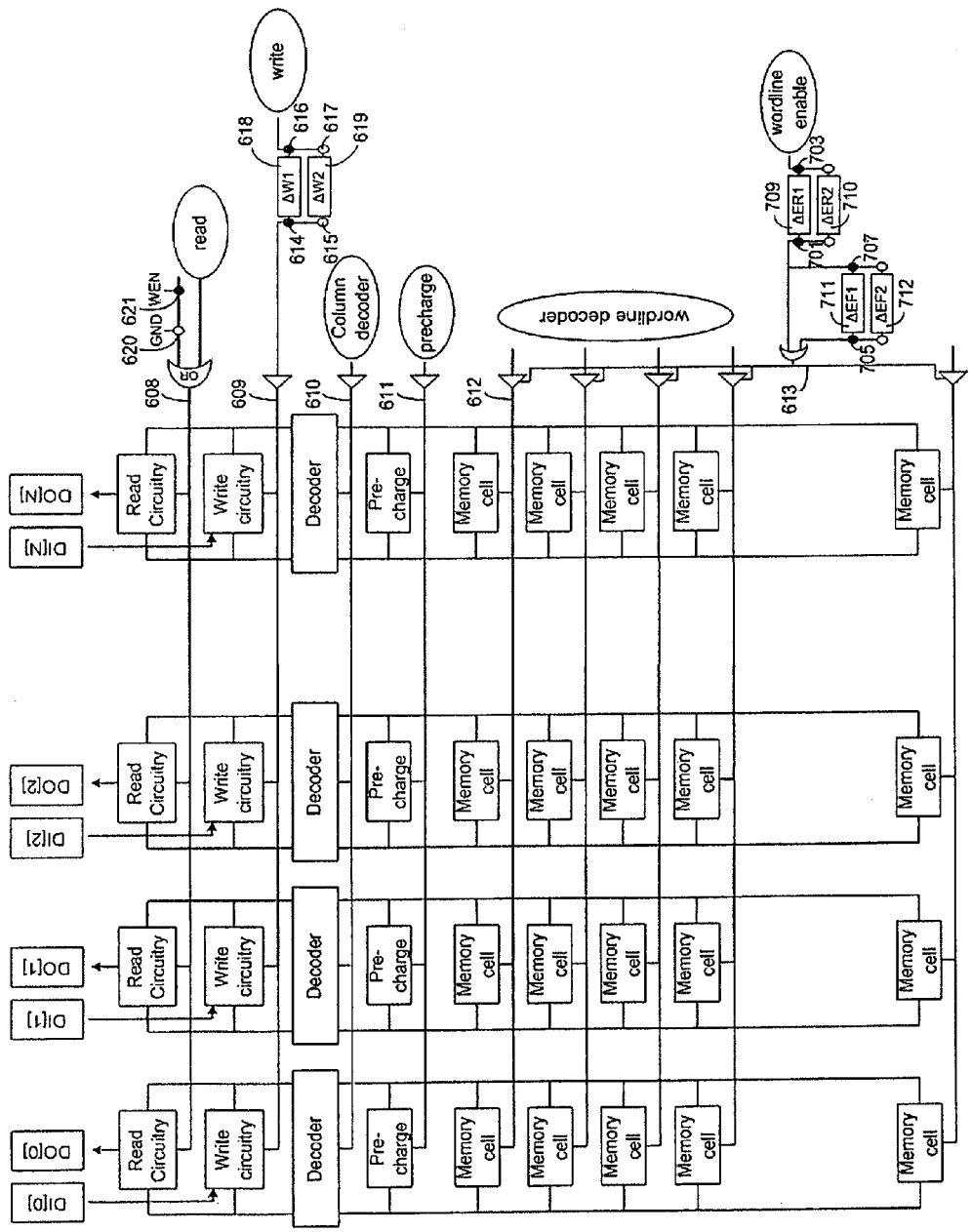
FIG. 12 is an example of a static configuration of the read-after-write policy in accordance with various embodiments of the present invention.

FIG. 12 is an example of static configuration of the read-after-write policy that may be derived from the circuit of FIG. 6, in accordance with various embodiments of the present invention. The configurations may be similar to the no-read-on-write policy, as shown in FIG. 10, except for the generation of read signal 608, where via 621 may be programmed instead of via 620. In the read-after-write policy, the read signal 608 may be the result from read logic being ORed with WEN, which effectively results in that the read signal may be generated by both read command and write command.

To dynamically configure the read-after-write policy, e.g., using the circuit of FIG. 8, mode selects 805, 806 and 803 may be set to "0", and mode select 808 may be set to "1". When mode select 808 is set to "1", the read signal 608 may be the result from read logic being ORed with WEN. As explained earlier, this may result in the read signal being generated by both the read and write commands. Both the static and dynamic configurations may have the same outcome, which may correspond to the timing waveforms of a read-after-write policy as shown in FIG. 11.

Figure 13:
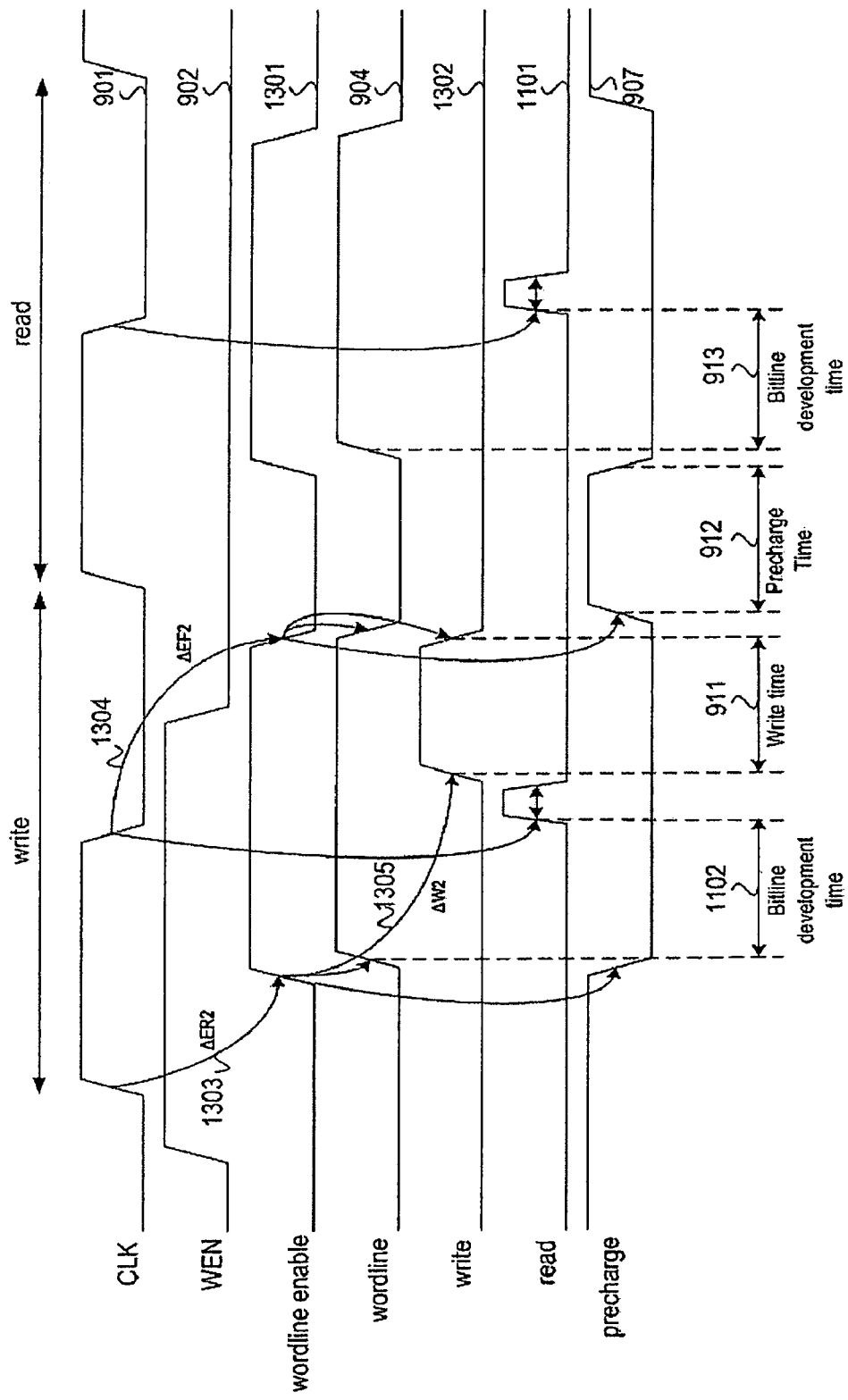
FIG. 13 illustrates waveforms demonstrating the relationships between various signals for the read-before-write policy, according to various embodiments of the invention.

FIG. 13 may illustrate waveforms demonstrating the relationships among various signals for the read-before-write policy. FIG. 13 includes waveforms for CLK 901, WEN 902, wordline enable 1303, wordline 904, write 1302, read 1101 and precharge 907. In the read-before-write policy, once the write command has been issued, a read operation may commence first, followed by a write operation, in a single cycle. To accomplish this, the wordline enable signal 1301 and write signal 1302 may be readjusted with respect to the read-after-write policy. The write signal 1302 may be delayed until the read operation is done. Thus, it may require a bigger delay W2 1305, as compared to W1 910 in both the read-after-write policy and the no-read-on-write policy discussed earlier. The wordline enable signal 1301 may be delayed as well. The rising edge of wordline enable signal 1301 may have a longer delay, e.g., ER2 delay 1303, from the clock 901, while the falling edge may use EF2 delay 1304 with respect the clock 901. As in the former two policies, the time allocated to do the successful write 911, successful precharge 912 and bitline development 913 and 1102 may be the same.

Figure 14:
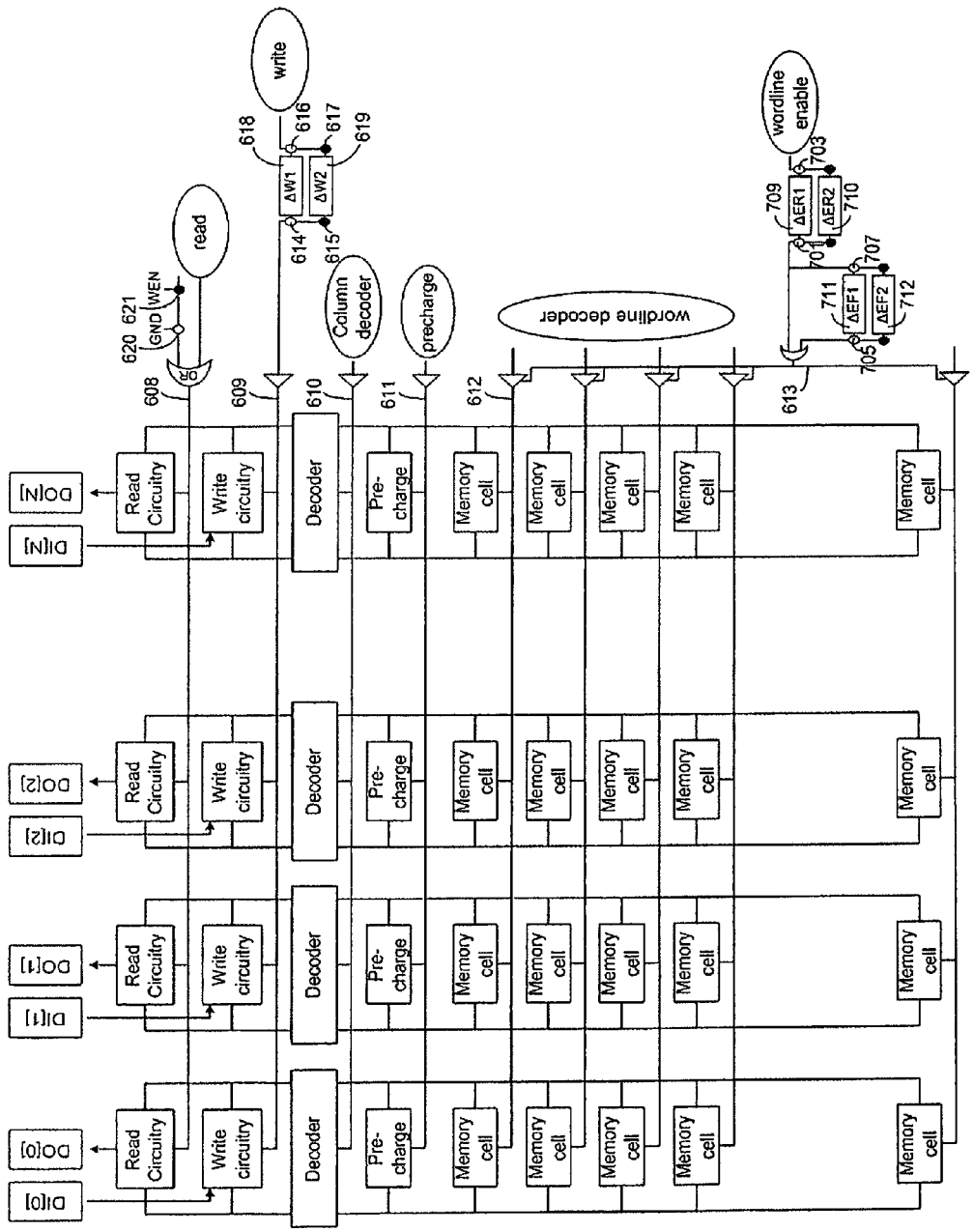
FIG. 14 is an example of a static configuration of the read-before-write policy in accordance with various embodiments of the present invention.

FIG. 14 is an example of a static configuration of the read-before-write policy derived from the circuit of FIG. 6, in accordance with various embodiments of the present invention. Similar to the read-after-write policy, the read signal 608 may be the result from read logic being ORed with WEN which effectively results in that the read signal may be generated by both the read command and the write command. Write signal 609 may be generated with W2 delay 619, which may correspond to the delay W2 1305 in FIG. 13. Wordline enable signal 613 may be generated with ER2 delay 710, and the falling edge of the wordline enable signal 613 may be further delayed with EF2 delay 712. These may correspond to the delays ER2 1303 and EF2 1304 in FIG. 13.

To dynamically configure read-before-write policy, the mode selects 805, 806, 803 and 808 may be set to "1". Referring to FIG. 8, read signal 608 may be the result from read logic being ORed with WEN, write signal 609 may be generated with W2 delay 619, wordline enable signal 613 may be generated with ER2 delay 710, and the falling edge of the wordline enable signal 613 may be further delayed with EF2 delay 712. Both the static and dynamic configurations may have the same outcome, which may correspond to the timing waveforms of a read-before-write policy as shown in FIG. 13.

Figure 15:
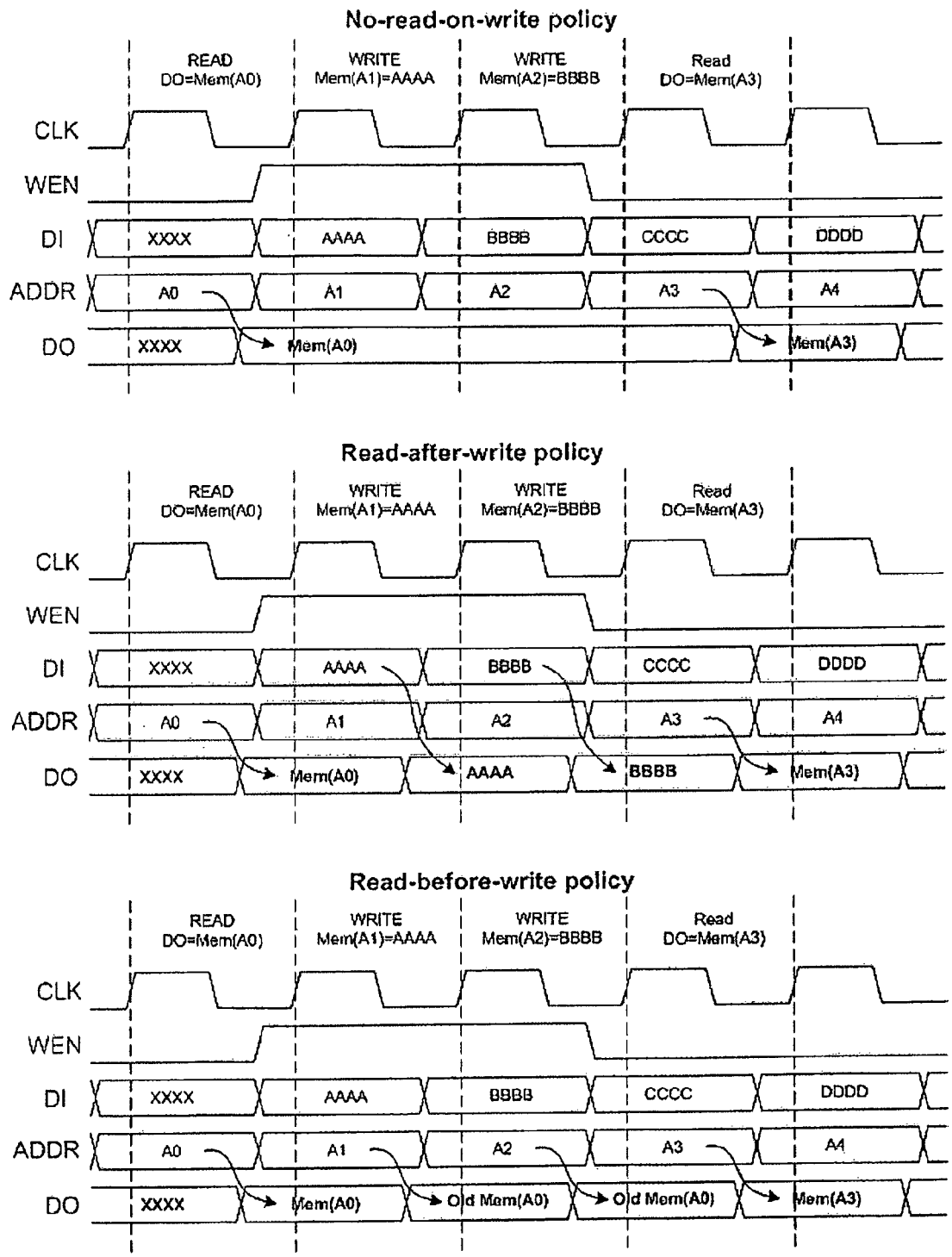
FIG. 15 illustrates waveforms demonstrating the memory output for the different write policies, according to various embodiments of the invention.

FIG. 15 illustrates waveforms that may be used to demonstrate exemplary memory output for all the three write policies. In the no-read-on-write policy, the output may maintain the data previously generated by a read operation, unaffected by the write operation. In the read-after-write policy, the output may correspond to the newly written data. The input data may be simultaneously written into the memory and at the same time being reflected at the output port. In the read-before-write policy, the output may have the data of the previously stored value while the new data is being written into that memory location.

Figure 16:
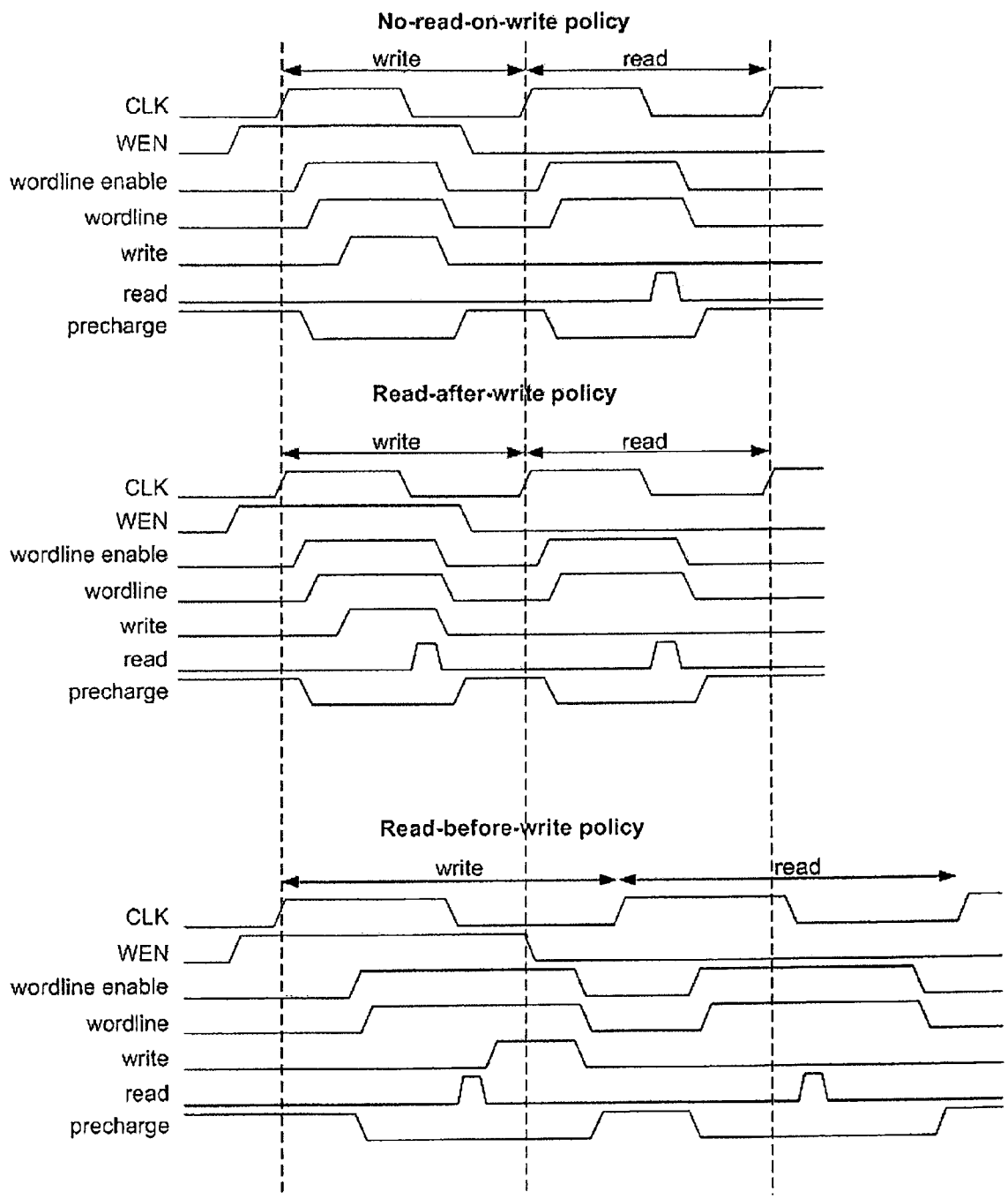
FIG. 16 illustrates a waveform comparison among the different write policies, according to various embodiments of the invention.

FIG. 16 illustrates a comparison of waveforms among the three write policies. In a conventional memory system, a read and write will take two cycles to be performed. By contrast, embodiments of the present invention may enable the read-before-write policy to be done in one cycle, without any timing penalty. Embodiments of the present invention may enable the read-after-write policy to be done in one cycle, as well, with an extra half-cycle timing penalty. By having the built-in read-before-write and read-after-write as in various embodiments of the present invention, the memory throughput may be improved and the effective bandwidth may be increased.

While the embodiments shown in the figures and discussed above may use either static or dynamic configuration, it is further contemplated that hybrid systems, in which some of the configuration may be static and some of the configuration may be dynamic, may also be used. Such systems may, for example, incorporate both programmable vias and multiplexers for configuration.

Various embodiments of the invention have been presented above. However, the invention is not intended to be limited to the specific embodiments presented, which have been presented for purposes of illustration. Rather, the invention extends to functional equivalents as would be within the scope of the appended claims. Those skilled in the art, having the benefit of the teachings of this specification, may make numerous modifications without departing from the scope and spirit of the invention in its various aspects.

What is claimed is:

1. A configurable memory circuit, comprising:
   at least one memory cell; and
   at least one configurable component coupled to the at least one memory cell and configured to permit a user to configure, in hardware, the configurable memory circuit to implement one of a plurality of memory access policies that the configurable memory circuit is capable of implementing;
   wherein the plurality of memory access policies comprises a no-read-on-write memory access policy, a read-after-write memory access policy, and a read-before-write access policy; and
   wherein which memory access policy is implemented depends upon how the at least one configurable component is configured.

2. The configurable memory circuit according to claim 1, wherein the at least one configurable component comprises at least one programmable via to enable static configuration of the memory access policy.

3. The configurable memory circuit according to claim 1, wherein the at least one configurable component comprises at least one multiplexer to enable dynamic configuration of the memory access policy.

4. The configurable memory circuit according to claim 1, wherein the at least one configurable component is adapted to control at least one control signal input to the configurable memory circuit.

5. The configurable memory circuit according to claim 4, wherein the at least one control signal input is selected from the group consisting of: a read signal; a write signal; a precharge signal; or a wordline enable signal.

6. The configurable memory circuit according to claim 1, further comprising at least one delay component, wherein the at least one delay component is to be selected using said at least one configurable component.

7. The configurable memory circuit according to claim 6, wherein the at least one delay component is, when selected, to delay at least one control signal input to the configurable memory circuit.

8. The configurable memory circuit according to claim 1, wherein the at least one configurable component is to select a gating signal to be used to generate a read signal.

9. The configurable memory circuit according to claim 1, wherein the at least one configurable component is arranged to control timing of at least one signal selected from the group consisting of: a write signal, a read signal, and a wordline enable signal.

10. A method of providing a configurable memory circuit, the method comprising:

providing one or more memory cells;

providing at least one configurable component coupled to at least one of said memory cells; and coupling the at least one configurable component to enable configuration, in hardware, of the configurable memory circuit to implement one of a plurality of memory access policies that the configurable memory circuit is capable of implementing, wherein the plurality of memory access policies comprises a no-read-on-write memory access policy, a read-after-write memory access policy, and a read-before-write memory access policy; and wherein which one of the plurality of memory access policies is implemented by the configurable memory circuit depends upon how the at least one configurable component is configured.

11. The method according to claim 10, further comprising:
coupling at least one of said configurable components to at least one delay component.

12. The method according to claim 10, further comprising:
coupling at least one of said configurable components to at least one control input to the configurable memory circuit.

13. The method according to claim 10, wherein the at least one configurable component is arranged to control timing of at least one signal selected from the group consisting of: a write signal, a read signal, and a wordline enable signal.

* * * * *